(12) United States Patent  
Pelley, III

(10) Patent No.: US 7,430,151 B2  
(45) Date of Patent: Sep. 30, 2008

(54) MEMORY WITH CLOCKED SENSE AMPLIFIER

(75) Inventor: Perry H. Pelley, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 164 days.

(21) Appl. No.: 11/392,402

(22) Filed: Mar. 29, 2006

(65) Prior Publication Data

US 2007/0237021 A1   Oct. 11, 2007

(51) Int. Cl.
*G11C 8/00* (2006.01)

(52) U.S. Cl. ............... 365/233.1; 365/154; 365/149; 365/205

(58) Field of Classification Search ........... 365/233, 365/154, 149, 233.1, 205
See application file for complete search history.

(56) References Cited

U.S. PATENT DOCUMENTS

| 5,563,834 | A | 10/1996 | Longway et al. |
| 6,181,626 | B1 | 1/2001 | Brown |
| 6,201,757 | B1 | 3/2001 | Ward et al. |
| 6,952,040 | B2 * | 10/2005 | Chau et al. ............ 257/412 |
| 2007/0064462 | A1 * | 3/2007 | Matsui ................. 365/63 |

* cited by examiner

*Primary Examiner*—Huan Hoang
(74) *Attorney, Agent, or Firm*—James L. Clingan, Jr.; Robert L. King

(57) ABSTRACT

In one form a memory and method thereof has a memory array having a plurality of columns of bit lines and a plurality of intersecting rows of word lines. Control circuitry is coupled to the memory array for successively accessing predetermined bit locations in the memory array during successive memory cycles. The control circuitry senses data within the memory array at a beginning of a predetermined memory cycle. Timing of the memory cycle is determined from a single external clock edge of a memory system clock. During a single memory cycle the memory initially performs the function of sensing followed by at least the functions of precharging the bit lines, addressing and developing a signal to be sensed. In one form each of the successive memory cycles is a period of time of no more than a single period of the memory system clock.

20 Claims, 2 Drawing Sheets

MEMORY WITH CLOCKED SENSE AMPLIFIER

FIELD OF THE INVENTION

This invention relates to circuits, and more particularly, to memory circuits.

BACKGROUND OF THE INVENTION

Memory circuits have continued to have more and more bits of storage primarily due to the continued scaling of the processes used in making the memory circuits. The scaling below 0.1 micron feature size, which has reduced both transistor sizes and power supply voltage, has also resulted in memory arrays that have memory cells that provide differing signal strength. The differing strength has had an adverse impact on speed of operation, which is generally directly related to the time required to perform a read operation. This has been particularly exacerbated with operating frequencies exceeding one gigahertz. To maintain a given speed requirement, memory circuits generally have certain amounts of time allotted to each of the various elements required for performing a read operation. The primary time allocations are a time from a valid address to enabling a word line, a time to achieve a sufficient signal on the bit line(s), a time from sensing the signal on the bit lines to providing an output, and a time to precharge in preparation for the next time a word line is enabled. The typical approach for improving speed is to try to reduce the time required for these operations with a cycle beginning with responding to a valid address. This has been effective in providing speed improvements as transistor switching speeds have improved with scaling. Speed, however, is not just dependent on switching speeds of the transistors but also on the strength of the memory cells. The strength of the memory cells, however, is not uniform and sometimes some cells are just too weak to meet the speed requirements and the particularly device must considered defective.

Thus, there is a need to reduce the number of defective devices and also to maintain improvements in speed with scaling.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a memory circuit begins a clock cycle by enabling a sense amplifier then, in the same cycle, subsequently enabling the address for the next cycle. Signal that is to be sensed is present on a bit line or a pair of bit lines. Longer time for developing the signal results in a bigger signal. The effect is that the logic state of a weaker memory cell is easier to sense if more time is available for developing the signal. With the sense amplifier being enabled by the beginning of the clock cycle, the time for developing the signal can be varied based on the clock cycle speed. Further if the other operations for reading such as precharge or driving the word line in response to an address are faster, there is more time for developing signal on the bit line(s). The result is that devices that have faster switching speeds can result in more time for signal development and thereby being able to detect the logic state of weaker memory cells. This is better understood by reference to the drawings and the following description.

Figure 1:
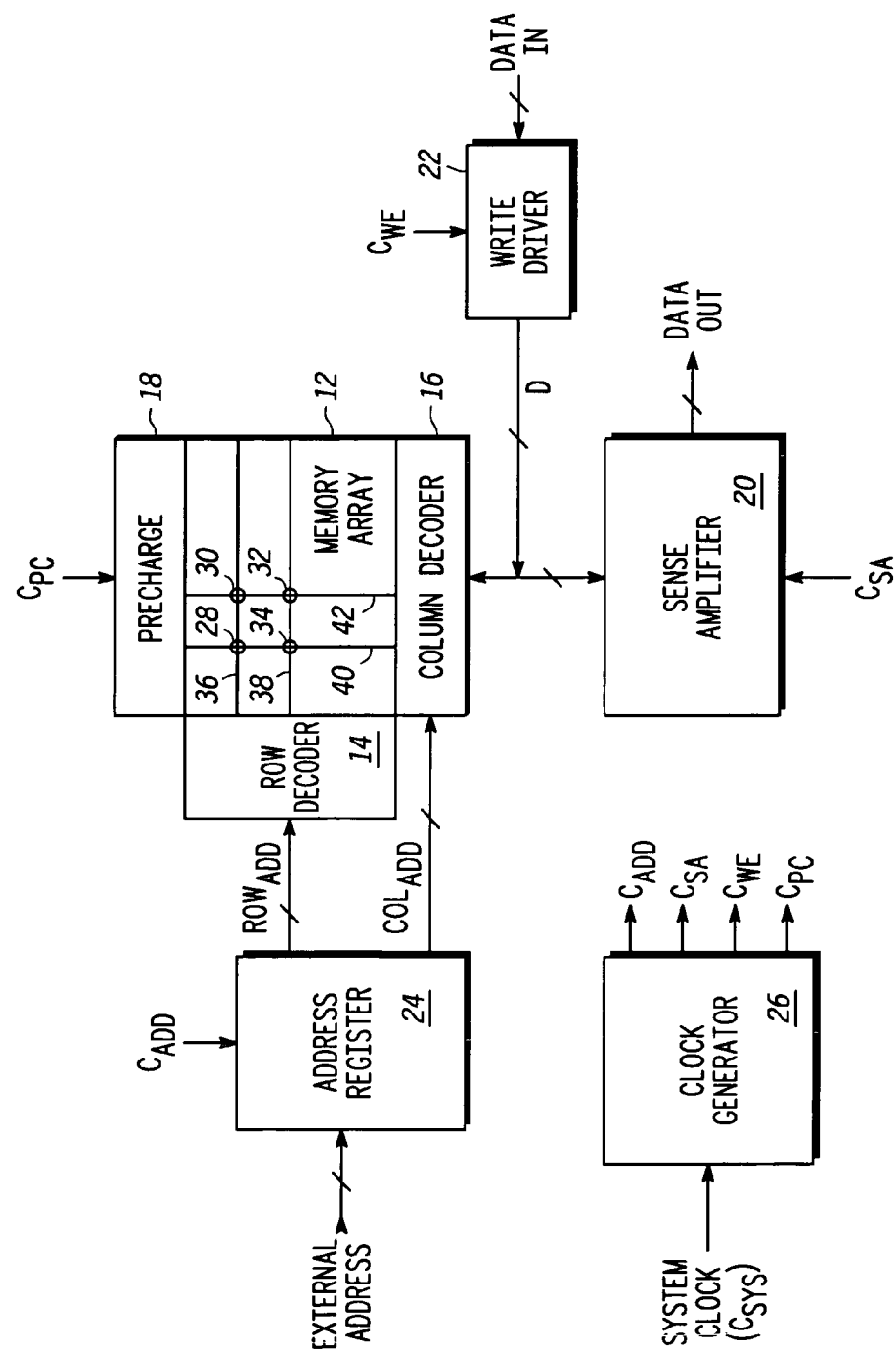
FIG. 1 is a memory circuit according to an embodiment of the invention.

Shown in FIG. 1 is a memory circuit 10 with a capability of operating at faster than one gigahertz and made with at least some transistor gate lengths below 0.1 micron comprising a memory array 12, a row decoder 14 coupled to array 12, a column decoder 16 coupled to array 12, a precharge circuit 18 coupled to array 12, a sense amplifier 20 coupled to column decoder 16, a write driver 22 coupled to column decoder 16, an address register 24 coupled to row decoder 14 and column decoder 16, and a clock generator 26 responsive to an external clock Csys for generating clock signals for address register 24, precharge circuit 18, write driver 22, and sense amplifier 20. Shown in FIG. 1 in memory array 12 are memory cells 28, 30, 32 and 34; word lines 36 and 38; and bit lines 40 and 42. Memory cells 28 and 30 are connected to word line 36. Memory cells 34 and 32 are connected to word line 38. Memory cells 28 and 34 are connected to bit line 40. Memory cells 30 and 32 are connected to bit line 42. Memory array 12 has many more memory cells located at intersections of many more bit lines and word lines than shown. It is not unusual for a memory array to have hundreds of millions of memory cells. The operation of memory array 12 and decoders 14 and 16 need not be anything unusual but can be a common memory such as a DRAM, SRAM, or a non-volatile memory. In the case of an SRAM, bit lines 40 and 42 would each be a complementary pair of bit lines connected to memory cells along a column.

In typical memory circuit fashion, address register 24 receives an external address and then provides a column address COLadd to column decoder 16, a row address ROWadd to row decoder 14. A word line selected by the row address enables cells along a row and the cells develop a signal on the bit line or bit lines to which they are connected. Column decoder 16 couples the developed signal to the sense amplifier which senses the developed signal on the selected bit line or bit lines and provides an output, data out of sense amplifier 20, corresponding to the developed signal.

Figure 2:
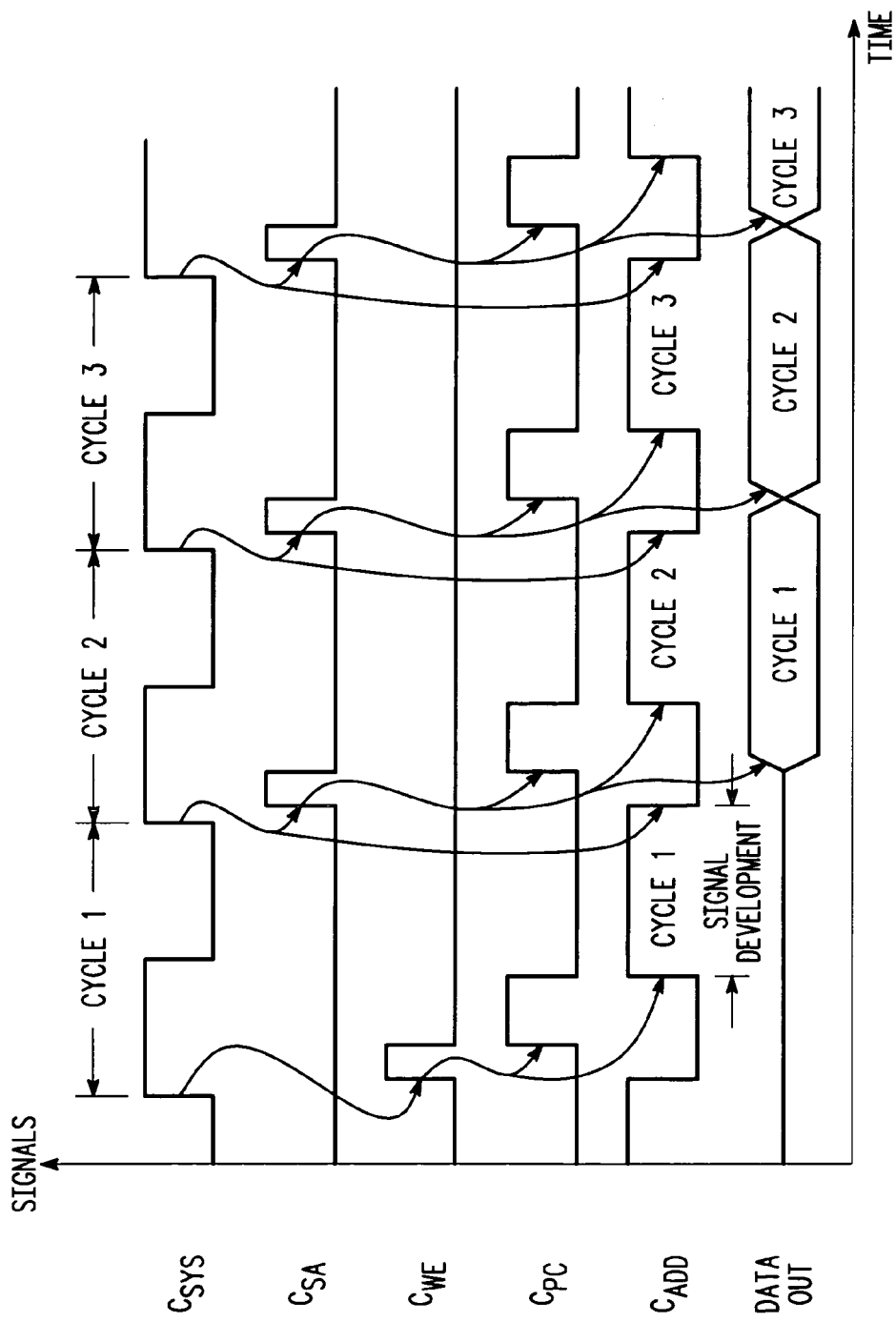
FIG. 2 is a timing diagram useful in understanding the operation of the memory circuit of FIG. 1.

The timing of the read operations, however, provides benefits relating to speed, memory cell signal sensing margin, and devices that need not be considered defective for having weak memory bits. The description of the timing is aided by referencing the signals shown in the timing diagram of FIG. 2. Cycle 1 begins with the external clock Csys, also commonly called the system clock, switching to a logic high. In this example, Cycle 1 is ending a write operation and beginning a read operation. The beginning of cycle 1 causes clock generator 26 to enable a write enable clock Cwe which causes write driver to couple a data in signal to column decoder 16 on a data bus D. Column decoder 16 is responsive to column address COLadd received during the previous cycle so that data is written on a bit line that was selected in the previous cycle. A word line is similarly selected by the row address ROWadd received in the previous cycle. The write operation is complete when write enable clock Cwe returns to its disabled state. In this example, a logic high is considered enabling and a logic low is considered disabling but this can be reversed for one or more of the operations.

The rising edge of the write enable clock in cycle 1 causes the generation of precharge clock Cpc. The bit lines of memory array 12 are precharged during the logic high of precharge clock Cpc. The rising edge of write enable clock Cwe also causes the generation of address clock Cadd. The generation of address clock Cadd causes a row address ROWadd to be coupled to row decoder 14 which in turn causes a word line of memory array 12 to be selected. The memory cells along the selected word line respond by developing a signal on the bit lines to which they are connected. At some time later the column address COLadd is coupled to column decoder 16 which couples a selected bit line to sense amplifier 20. Sense amplifier 20, however, is not enabled until the beginning of the next cycle, cycle 2. When cycle 2 does begin, clock generator 26 responds by providing sense amp enable clock Csa at a logic high. Sense amplifier 20 responds by sensing the logic state represented by the signal that has been developed on the selected bit line and provides a corresponding data output signal. Sense amplifier 20 thus provides the output corresponding to the logic state of the memory cell selected by the external address during cycle 1 at the beginning the next cycle, cycle 2 in this case. Clock generator 26 also responds to the beginning of cycle 2 by terminating the address clock Cadd which disables row decoder 14 and column decoder 16 through the disabling of the row and column address clocks ROWadd and COLadd. Thus, although both the read operation and a write operation overlap clock edges, the total time of a read or write operation does not exceed the time of one cycle.

As the read operation continues, clock generator 26 responds to the rising edge of the sense amp enable clock Csa by providing precharge clock Cpc for precharging the bit lines of memory array 12. Column decoder 16 and row decoder 14 are disabled during the precharge operation. Clock generator 26 responds to the enabling of sense amp enable clock Csa by enabling address clock Cadd. Address register 24 responds to the enabling of address clock Cadd by providing the row address ROWadd, derived from the external address, to row decoder 14 which in turn responds by enabling a word line selected by row address ROWadd. The memory cells along the selected word line begin developing signal representative of their logic state on the bit lines to which they are connected. The column decoder 16 couples a selected bit line to sense amplifier 20 in response to the column address COLadd which is provided by address register 24 and which is derived from the external address. The signals on the bit lines continue developing while row decoder 14 and column decoder 16 are enabled. The beginning of cycle 3 causes clock generator 26 to enable sense amp enable clock Csa which causes sense amplifier 20 to detect the signal developed on the selected bit line and provide the data out signal in correspondence to the cell selected by the external address during cycle 2.

Clock generator 26 responds to the beginning of cycle 3 by terminating address clock Cadd. Clock generator 26 responds to sense amp enable clock being enabled by enabling precharge clock Cpc and address clock Cadd. Precharge clock Cpc enables precharge circuit 18 to precharge the bit lines of memory array 12. The termination of precharge clock Cpc is self-timed. Although address clock Cadd is responsive to sense amp enable clock Csa, address clock Cadd is delayed so that precharge of the bit lines is complete before memory cells in memory array are being enabled in response to a row address ROWadd. When address clock Cadd is enabled during cycle 3, signal is being developed by the selected cell on the selected word line and bit line as selected by the external address. The development of the signal on the selected bit line is not terminated until the beginning of the next cycle. The next cycle results in the enabling of the sense amp enable clock Csa and the outputting of the data representative of the logic state of the memory cell selected during cycle 3. The effect of this particular embodiment is that the beginning of a current cycle, as indicated by the system clock Csys, begins a sequence of operations beginning with the enabling of the sense amplifier that provides a signal representative of the logic state of the memory cell selected by the external provided during the previous cycle. Also in response to the beginning of the current cycle but occurring after the sensing, the selected word line is enabled so that signal on the bit lines can be developed continuously until the beginning of the next cycle.

There are several benefits of this approach. In a typical memory, higher speeds for a given process occur when the channel lengths are shorter than the average for the particular manufacturing process. The result of the shorter channel lengths is faster switching speeds which has the effect of shortening the time required for addressing, decoding, and precharging. On the other hand, however, the shorter channel lengths for the switching transistors can also correlate to weaker memory cells, cells with less signal strength. Thus, the time for a sufficient signal to develop on the bit lines is increased. In the described example, the operations such as precharging, addressing, and decoding are speeded up so that the signal development begins earlier in the cycle and the signal development continues until the beginning of the next cycle. Thus, there is more time for signal development which allows for weaker cells to be able to develop the required signal for sensing. These same cells, however, may not be able to develop the required signal in the typical time allotted for developing the signal.

Another benefit is that a device with weak cells can have its cycle lengthened to provide more time for signal development. Thus, instead of being defective, the device just operates at a longer cycle time. In the case where the time for signal development is self-timed, lengthening the cycle time would not actually provide for more time for signal development. A similar benefit can occur for the case where all of bits are strong so that the time for developing sufficient signal is shorter than average. In such case the cycle can be shortened so that the device can be specified as being faster than the average device. Faster devices generally sell for more. If the time for signal development is self-timed, reducing the cycle time would take time away from some other operation, such as precharging, which may not be able to be reduced.

Also generally signal development on the bit lines is a high sensitivity operation so that signal margin in that operation can be important. Margin on that operation can be achieved simply by increasing the cycle time. If the signal development is self-timed, however, increasing cycle does not have the effect of increasing margin for signal development but rather increasing for an operation, such are precharging, that generally is more tightly controlled and in less need of margin.

In this example, the address provided in one cycle is actually for a location in the memory that is provided in response to entering the next cycle. The last write cycle before the read cycle can be used to provide the address of the location to be read in the first read cycle. This avoids a wasted cycle at the beginning of series of read cycles or the requirement for two read cycles to perform a single read cycle. Other alternatives than that shown for performing a write may also be used.

Various other changes and modifications to the embodiments herein chosen for purposes of illustration will readily occur to those skilled in the art. For example, the external address could be multiplexed in which the row address is first received followed by the column address. In such case the address clock shown in FIG. 2 would still be representative of the whole time that the word line is enabled so that signal is developed. Memory 10 is shown as having a single memory array 12, but memory 10 could have many other memory arrays requiring additional decoding of the external address. Sense amplifier 20 was described as providing a single data out signal but could provide many output signals. Also a single memory cell was described as being selected but more than one could be selected either in the same array as array 12 or in other arrays not shown. The type of precharging was not specified but is typically to the positive power supply voltage but can be chosen to be some other voltage. To the extent that such modifications and variations do not depart from the spirit of the invention, they are intended to be included within the scope thereof which is assessed only by a fair interpretation of the following claims.

The invention claimed is:

1. A memory comprising:
   a memory array having a plurality of columns of bit lines and a plurality of intersecting rows of word lines; and
   control circuitry coupled to the memory array for successively accessing predetermined bit locations in the memory array during successive memory cycles, the control circuitry initiating sensing data within the memory array at a beginning of a predetermined memory cycle, wherein timing of the memory cycle is determined from a single external clock edge, and an enabling of an address for data to be sensed at a beginning of a subsequent memory cycle to the predetermined memory cycle is performed in response to the beginning of the predetermined memory cycle and after the sensing of the data that occurs at the beginning of the predetermined memory cycle.

2. The memory of claim 1 wherein during a single memory cycle the memory performs developing a signal for the data to be sensed at the beginning of the subsequent memory cycle in response to the enabling of the address, wherein a time period for developing the signal increases with an increase in a time period of the memory cycle.

3. The memory of claim 1 wherein the memory is an SRAM.

4. The memory of claim 1 wherein the memory is a DRAM.

5. The memory of claim 1 wherein the memory operates with a clock cycle of greater than 1 GHz.

6. The memory of claim 1 wherein the memory bits are implemented with transistors having a gate length of less than 0.1 micron.

7. The memory of claim 1 wherein each of the successive memory cycles comprises a period of time of no more than a single period of a system clock of the memory.

8. The memory of claim 1 wherein the memory is further characterized by data within the memory array being located at an address that is provided by the control circuitry during an immediately previous memory cycle.

9. A memory comprising:
   a memory array having a plurality of columns of bit lines and a plurality of intersecting rows of word lines; and
   control circuitry coupled to the memory array for successively accessing predetermined bit locations in the memory array during successive memory cycles, the control circuitry controlling the memory to perform during a single memory cycle at least the functions of initiating sensing a logic state of a first bit, then precharging the plurality of columns of bit lines, then addressing a second bit location, and then developing a signal to be sensed from the second bit location, wherein sensing of a logic state of the second bit location is initiated at a beginning of subsequent memory cycle.

10. The memory of claim 9 wherein the memory is an SRAM.

11. The memory of claim 9 wherein the memory is a DRAM.

12. The memory of claim 9 wherein the memory operates with a clock cycle of greater than 1 GHz.

13. The memory of claim 9 wherein the memory bits are implemented with transistors having a gate length of less than 0.1 micron.

14. The memory of claim 9 wherein each of the successive memory cycles comprises a period of time of no more than a single period of a system clock of the memory.

15. The memory of claim 9 further comprising data within the memory array during a predetermined memory cycle that is located at an address that is provided by the control circuitry during an immediately previous memory cycle to the predetermined memory cycle.

16. A method comprising:
    providing a memory having a memory array with a plurality of columns of bit lines and a plurality of intersecting rows of word lines;
    coupling a system clock signal to the memory;
    creating a plurality of successive memory clocks from the system clock signal for self-timing the memory;
    successively accessing predetermined bit locations in the memory array during the plurality of successive memory clocks; and
    initiating sensing data within the memory array as a first operation at a beginning of a predetermined memory clock, wherein timing of the plurality of successive memory clocks is determined from a single clock edge of the system clock signal and the data was developed during a memory clock immediately prior to the predetermined memory clock.

17. The method of claim 16 further comprising:
    performing at least the functions of initially sensing the memory followed by precharging the plurality of columns of bit lines, addressing the memory and developing a signal to be sensed during a single memory cycle.

18. The method of claim 16 further comprising:
    implementing each of the plurality of successive memory cycles having a period of time of no more than a period of the system clock.

19. The method of claim 16 further comprising:
    implementing the memory as a static random access memory (SRAM).

20. The method of claim 16 further comprising:
    implementing the memory as a dynamic random access memory (DRAM).

* * * * *